US011607743B2

(12) United States Patent
 Manthe (10) Patent No.: US 11,607,743 B2
(45) Date of Patent: Mar. 21, 2023

(54) METHODS, SYSTEMS, AND APPARATUS FOR VERIFYING A SWITCHED MODE POWER SUPPLY TOPOLOGY

(71) Applicant: Illinois Tool Works Inc., Glenview, IL (US)

(72) Inventor: Alan A. Manthe, Hortonville, WI (US)

(73) Assignee: ILLINOIS TOOL WORKS INC., Glenview, IL (US)

(*) Notice: Subject to any disclaimer, the term of this patent is extended or adjusted under 35 U.S.C. 154(b) by 442 days.

(21) Appl. No.: 16/725,373

(22) Filed: Dec. 23, 2019

(65) Prior Publication Data
US 2021/0187649 A1    Jun. 24, 2021

(51) Int. Cl.
 *B23K 9/10*  (2006.01)
 *H02M 3/157*  (2006.01)
(52) U.S. Cl.
 CPC ........... *B23K 9/1056* (2013.01); *H02M 3/157* (2013.01)
(58) Field of Classification Search
 CPC ........ B23K 9/10; B23K 9/095; B23K 9/1043; B23K 9/1012; B23K 9/1006; B23K 9/1062; B23K 9/1056; H02M 3/157
 See application file for complete search history.

(56) References Cited

U.S. PATENT DOCUMENTS

| 5,446,641 A | 8/1995 | Reynolds et al. |
| 5,824,990 A | 10/1998 | Geissler |
| 6,549,441 B1 * | 4/2003 | Aigner ................. B23K 9/095 219/130.21 |
| 2014/0021180 A1 * | 1/2014 | Vogel ................. B23K 9/1062 219/130.1 |
| 2014/0374397 A1 | 12/2014 | Vogel |
| 2015/0053660 A1 | 2/2015 | Schartner |
| 2017/0207652 A1 * | 7/2017 | Morita ................. H02J 1/102 |

FOREIGN PATENT DOCUMENTS

| KR | 20080005422 U | 11/2008 |
| WO | 2008022654 | 2/2008 |

OTHER PUBLICATIONS

European Patent Office, Communication with extended European Search Report, Application No. 20213476.3, dated May 4, 2021 (7 pages).
European Patent Office, Communication Pursuant to Article 94(3) EPC, application No. 20213476.3, dated Aug. 26, 2022, 4 pages.

* cited by examiner

*Primary Examiner* — Brian W Jennison
(74) *Attorney, Agent, or Firm* — McAndrews, Held & Malloy, Ltd.

(57) ABSTRACT

Power electronics, including welding-type power supplies may have a switched mode power supply configurable in two or more topologies. Detection circuitry of the power electronics may determine the configured topology of the switched mode power supply and the input voltage supplied to the power electronics. The detection circuitry and/or control circuitry of the power electronics may verify that the configured topology of the switched mode power supply corresponds to the supplied input voltage, and may indicate an error if the configured topology does not correspond to the supplied input voltage.

20 Claims, 5 Drawing Sheets

METHODS, SYSTEMS, AND APPARATUS FOR VERIFYING A SWITCHED MODE POWER SUPPLY TOPOLOGY

BACKGROUND

The present disclosure relates to power electronics systems including welding systems and, more particularly, to methods, systems, and apparatus for verifying a topology of a switched mode power supply.

In power electronics, including in welding-type power supplies, a switched mode power supply may be configured in various topologies based on the wiring of the switches. Some power electronics may also be configured to receive a range of input voltages, which can be divided up into multiple ranges. Disclosed example methods, systems, and apparatus verify that the configured switched mode power supply topology corresponds to the input voltage range, which may prevent operating inefficiency or damage to the power electronics.

SUMMARY

Methods, systems, and apparatus for determining and verifying a topology of a switched mode power supply are disclosed, substantially as illustrated by and described in connection with at least one of the figures, as set forth more completely in the claims.

BRIEF DESCRIPTION OF THE DRAWINGS

The figures are not necessarily to scale. Where appropriate, similar or identical reference numbers are used to refer to similar or identical components.

DETAILED DESCRIPTION

Power electronics may include switched mode power supplies which convert input power to usable power for a high-power application. For example, in welding applications, a welding-type power supply may include a switched mode power supply which converts input power to welding-type power for a welding-type load. In some power electronic devices such as a welding-type power supply, the topology of the switched mode power supply may be configurable into two or more topologies. For a given power electronic device, certain switched mode power supply topologies are operable at certain input voltage ranges. For example, for the same power electronic device, a stacked full bridge may be operable at higher voltages as compared to a full H-bridge topology. If the topology of the switched mode power supply does not correspond to the input voltage, the power electronics may not operate efficiently or, in some examples, the power electronics may be damaged by excess voltage or current. Therefore, disclosed power electronic devices including configurable switched mode power supplies, include circuitry configured to determine the actual configured topology of the switched mode power supply, determine the input power voltage, and determine whether the switched mode power supply topology corresponds to the determined input power voltage. Disclosed power electronic devices may also indicate (e.g., to an operator) when the switched mode power supply topology does not correspond to the input voltage.

Disclosed example welding-type power supplies include: power conversion circuitry configured to receive input power and convert the input power to welding-type power, the power conversion circuitry including a switched mode power supply; and detection circuitry configured to: determine if a configured topology of the switched mode power supply is a first topology or a second topology; and determine if an input voltage of the input power corresponds to the first topology or the second topology.

Some disclosed example welding-type power supplies further include control circuitry configured to prevent the power conversion circuitry from outputting welding-type power if the input voltage does not correspond to the configured switched mode power supply topology.

Some disclosed example welding-type power supplies further include control circuitry configured to prevent the welding-type power supply from executing a start-up routine if the input voltage does not correspond to the configured switched mode power supply topology.

In some disclosed example welding-type power supplies, the first topology is a Full H-bridge topology and the second topology is a stacked full bridge topology.

In some disclosed example welding-type power supplies, the detection circuitry is configured to compare a magnitude of the input voltage to a threshold to determine whether the input voltage corresponds to a Full H-bridge topology or a stacked full bridge topology.

In some disclosed example welding-type power supplies, the input voltage corresponds to a stacked full bridge topology if the magnitude exceeds the threshold.

Some disclosed example welding-type power supplies further include a voltage sensor to measure a voltage difference between at least two nodes of the switched mode power supply, and the detection circuitry is configured to determine the topology of the switched mode power supply based on the measured voltage.

Some disclosed example welding-type power supplies further include a resistance sensor to measure a resistance between at least two nodes of the switched mode power supply, wherein the detection circuitry is configured to determine the topology of the switched mode power supply based on the measured resistance.

In some disclosed example welding-type power supplies, the switched mode power supply comprises four switches.

Some disclosed example welding-type power supplies further include a sensor configured to measure at least one of a voltage difference or a resistance between at least two of the switches.

In some disclosed example welding-type power supplies, the detection circuitry is configured to determine that the configured topology is a stacked full-bridge topology in response to determining that the measured voltage exceeds a threshold.

In some disclosed example welding-type power supplies, the detection circuitry is configured to determine that the configured topology is a stacked full-bridge topology in response to determining that the measured resistance exceeds a threshold.

In some disclosed example welding-type power supplies, the detection circuitry is configured to determine that the configured topology is a Full H-bridge topology in response to determining that the measured voltage exceeds a threshold.

In some disclosed example welding-type power supplies, the detection circuitry is configured to determine that the topology is a Full H-bridge topology if the measured resistance exceeds a threshold.

In some disclosed example welding-type power supplies, the detection circuitry is configured to determine that the configured topology is a stacked full-bridge topology in response to determining that the measured voltage does not exceed a threshold.

In some disclosed example welding-type power supplies, the detection circuitry is configured to determine that the configured topology is a stacked full-bridge topology in response to determining that the measured resistance does not exceed a threshold.

In some disclosed example welding-type power supplies, the detection circuitry is configured to determine that the configured topology is a Full H-bridge topology in response to determining that the measured voltage does not exceed a threshold.

In some disclosed example welding-type power supplies, the detection circuitry is configured to determine that the topology is a Full H-bridge topology if the measured resistance does not exceed a threshold.

In some disclosed example welding-type power supplies, the detection circuitry is configured to output an alert if the input voltage does not correspond to the configured switched mode power supply topology.

Some disclosed example welding-type power supplies further include a user interface, and the user interface is configured to provide an indication that the input voltage does not correspond to the configured switched mode power supply topology.

In some disclosed example welding-type power supplies, the detection circuitry includes a sensor configured to determine an installed position of at least one connector of the switched mode power supply.

Some disclosed example welding-type power supplies further include a user operable switch configured to select the topology of the switched mode power supply based on the position of the switch, and the detection circuitry is configured to determine the configured topology based on a detection of the position of the switch.

Some disclosed example welding-type power supplies further include a linking board, and an installed position of the linking board controls the topology of the switched mode power supply, and wherein the detection circuitry is configured to determine the configured topology based on a detection of the installed position of the linking board.

Disclosed example welding-type power supplies include: an input configured to receive input power; a sensor configured to measure a magnitude of the voltage of the input power; a switched mode power supply; and detection circuitry configured to: determine if a configured topology of the switched mode power supply is a first topology or a second topology; and determine if the measured magnitude of the voltage of the input power corresponds to the first topology or the second topology.

As used herein, the term "welding-type power" refers to power suitable for welding, plasma cutting, induction heating, CAC-A and/or hot wire welding/preheating (including laser welding and laser cladding). As used herein, the term "welding-type power supply" refers to any device capable of, when power is applied thereto, supplying welding, plasma cutting, induction heating, CAC-A and/or hot wire welding/preheating (including laser welding and laser cladding) power, including but not limited to inverters, converters, resonant power supplies, quasi-resonant power supplies, and the like, as well as control circuitry and other ancillary circuitry associated therewith.

As used herein, a welding-type power supply refers to any device capable of, when power is applied thereto, supplying welding, cladding, plasma cutting, induction heating, laser (including laser welding, laser hybrid, and laser cladding), carbon arc cutting or gouging and/or resistive preheating, including but not limited to transformer-rectifiers, inverters, converters, resonant power supplies, quasi-resonant power supplies, switch-mode power supplies, etc., as well as control circuitry and other ancillary circuitry associated therewith.

As used herein, the terms "circuit" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code.

The terms "control circuit" and "control circuitry," as used herein, may include digital and/or analog circuitry, discrete and/or integrated circuitry, microprocessors, digital signal processors (DSPs), and/or other logic circuitry, and/or associated software, hardware, and/or firmware. Control circuits may include memory and a processor to execute instructions stored in memory. Control circuits or control circuitry may be located on one or more circuit boards, that form part or all of a controller, and are used to control a welding process, a device such as a power source or wire feeder, motion, automation, monitoring, air filtration, displays, and/or any other type of welding-related system.

As used, herein, the term "memory" and/or "memory device" means computer hardware or circuitry to store information for use by a processor and/or other digital device. The memory and/or memory device can be any suitable type of computer memory or any other type of electronic storage medium, such as, for example, read-only memory (ROM), random access memory (RAM), cache memory, compact disc read-only memory (CDROM), electro-optical memory, magneto-optical memory, programmable read-only memory (PROM), erasable programmable read-only memory (EPROM), electrically-erasable programmable read-only memory (EEPROM), flash memory, solid state storage, a computer-readable medium, or the like.

As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1:
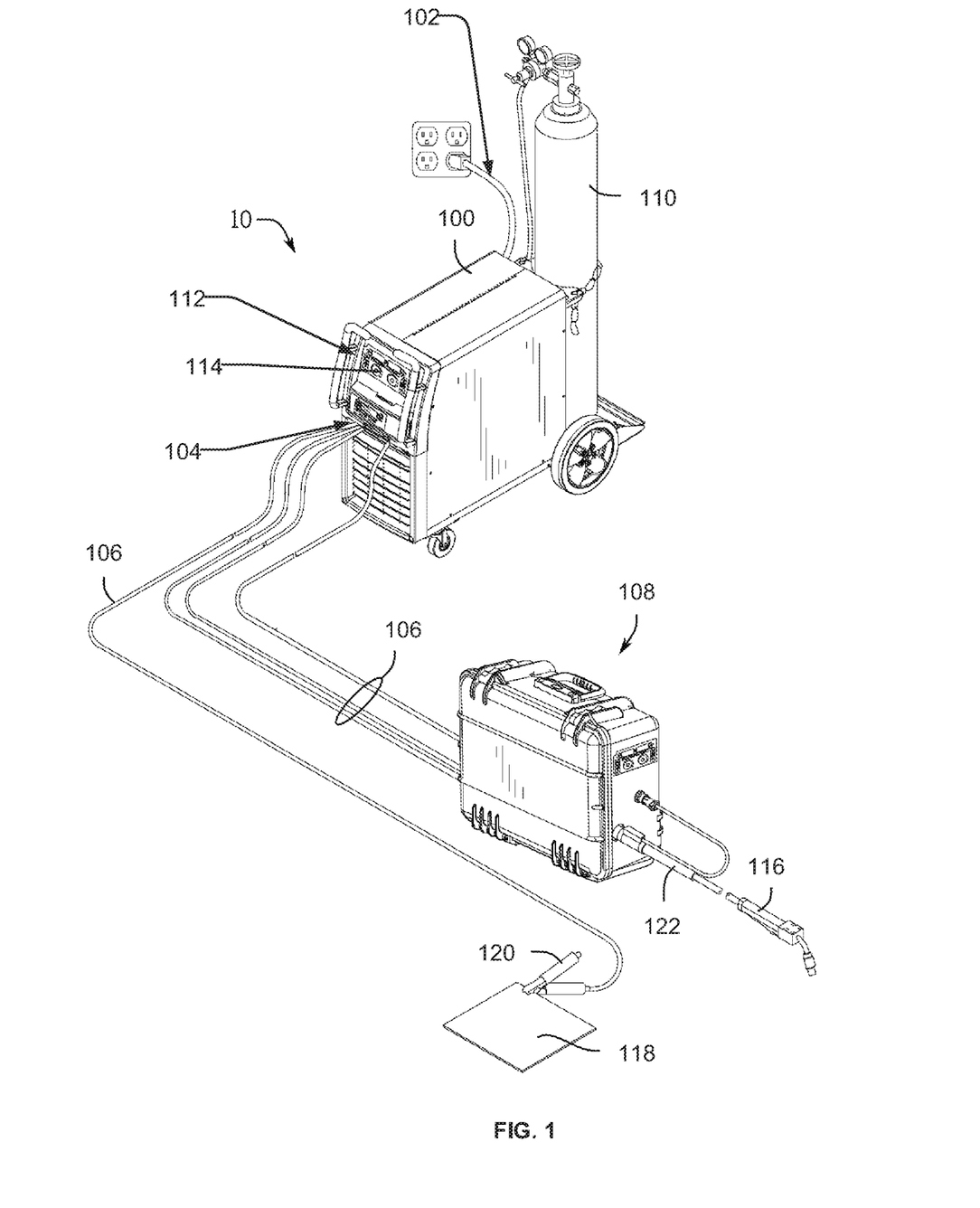
FIG. 1 is an illustration of an example welding-type system in accordance with aspects of this disclosure.

FIG. 1 illustrates an exemplary welding type system 10 including a welding-type power supply 100. A source of power is provided to the welding-type power supply 100 via an AC power cord 102. Typical ranges of AC power may be 115/230 VAC or 208-600 VAC, and may include singlephase or three-phase power. The example of FIG. 1 shows a 110 VAC outlet, but the welding-type power supply 100 and/or the power cord 102 may be adapted or replaced to support one or more other sources of electrical power, such as other input voltages, hard wiring of the power supply 100 to the electrical source, engine-driven generator sources, and/or other sources of electrical power.

The example welding-type power supply 100 generally supplies power for the welding-type system 10. Weld output 104 provides welding output power via one or more weld cables 106 coupled to a welding torch 116 and a workpiece 118 using a clamp 120. Welding output power may be in the range of 10 Amps to 600 amps or more, and range from 0 volts at short circuit to 44 volts or more into an open welding arc. Modern welding power sources and systems can provide welding type power for various weld processes which may include advanced waveform generation and control that is responsive to dynamic or static conditions at the welding arc.

The illustrated welding type system includes a wire feeder 108 and a gas supply 110. The welding-type power supply 100 may provide power and control to other equipment such as a wire feeder 108. In the illustrated example, the welding torch 116 is coupled to the wire feeder 108 via coupler 122 in order to supply welding wire, shielding gas from the gas supply 110, and/or welding-type power to the welding torch 116 during operation of the welding-type system 10. In some examples, the welding-type power supply 100 may couple and/or directly supply welding-type power to the welding torch 116. The wire feeder 108 may require a certain type of power, for example, 24V or 50V for proper operation of the wire feeder 108 control circuits. The power for the wire feeder 108 may be provided by the welding-type power supply 100 by a wire feeder 108 power supply circuit, or another type power circuit. In addition to power for the wire feeder 108, one or more control signals may also be provided to allow proper operation of the wire feeder 108 and welding-type power supply 100. These control signals may be analog or digital and may provide control and communication in a bi-directional manner. The power and control signals may be provided to the wire feeder 108 from the welding power source via cable(s) 106.

The illustrated welding-type power supply 100 has a control panel 112 with various types of control features 112, such as digital displays, control dials or potentiometers, control switches, LED indicators, etc. These control features 112 provide for normal operation and control of the welding system. In addition, these control features are used to signal or indicate an internal fault or abnormal condition that has been detected with the welding-type power supply 100. For example, an LED indicator may be lit for a thermal overload condition, if the output capability or rating of the welding-type power supply 100 has been exceeded, or if the input power is unsupported.

Figure 2:
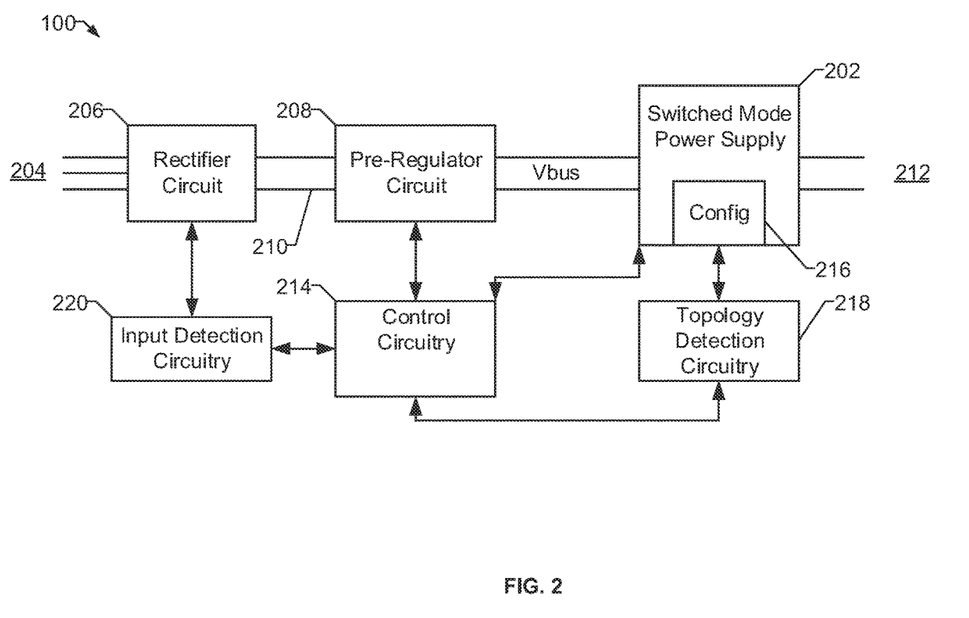
FIG. 2 is a block diagram of the example welding-type power supply.

FIG. 2 is a block diagram of an example welding-type power supply that may implement the welding-type power supply 100 of FIG. 1. The welding-type power supply 100 includes a switched mode power supply 202 which includes a plurality of controllable switches. The example welding-type power supply 100 receives AC input power 204, which is rectified at the rectifier circuit 206. In some examples, a pre-regulator circuit 208 provides a regulated bus voltage (e.g., $V_{bus}$), which may be regulated to a voltage greater than the peak of the rectified line voltage 210.

The switched mode power supply 202 receives the bus voltage $V_{bus}$ and outputs welding-type power 212. The switched mode power supply 202 includes a plurality of switches, capacitor(s), and a high-frequency transformer. The components of the switched mode power supply 202 (e.g., the plurality of switches, the capacitors, and a high-frequency transformer) may be connectable such that the switched mode power supply 202 has various configurable topologies. For example, the components of the switched mode power supply 202 may be connected such that the switched mode power supply 202 is configured in a Full H-bridge topology or is configured in a stacked full-bridge topology. Certain topologies may be desirable for certain power inputs (e.g., the magnitude of the voltage of the power supplied to the input 204), certain welding type outputs, and/or certain welding-type applications.

The topology of the switched mode power supply 202 may be configured in various ways. In some examples, the switched mode power supply 202 may be manually configured via connecting jumper wires to nodes of the switched mode power supply 202. In some examples, a switch may be toggled (e.g., a switch on the outside of the power supply 100) which controls configuration circuitry 216 which automatically makes the connections to configure the switched mode power supply 202 into the selected configuration. In some examples, an operator may select a switched mode power supply 202 topology via the control panel 112, and the configuration circuitry 216 automatically configures the switched mode power supply 202 based on the selection. In some examples, the power supply 100 may include a slot to receive a linking device having pins (e.g., a link board). Inserting the linking board completes connections of the switched mode power supply 202, such that various linking boards may configure the switched mode power supply 202 in various topologies. In some examples, a linking board may have a header with shorted pins. The linking board may be moved from one location to another to configure the switched mode power supply 202 into various topologies.

Figure 3A:
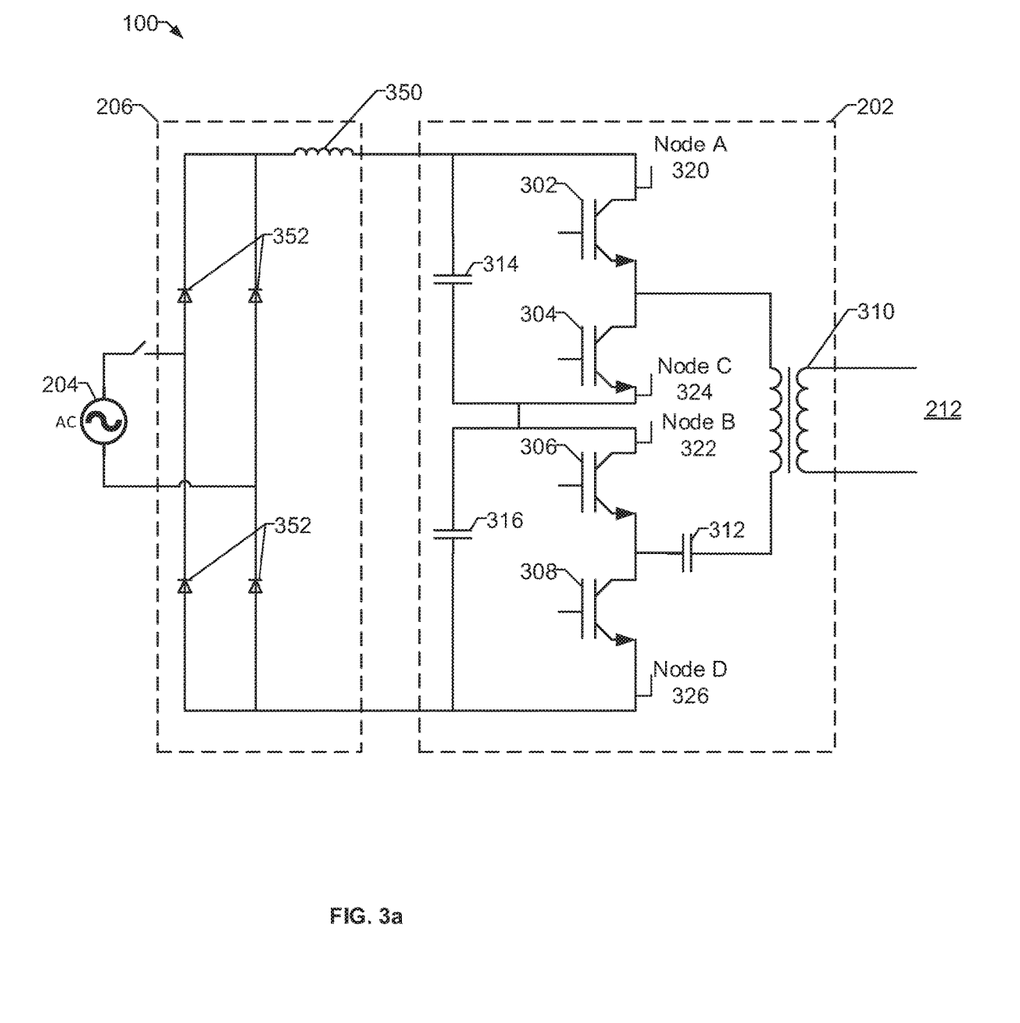
FIG. 3a is a schematic diagram of a the welding-type power supply of FIG. 2, in which the switched mode power supply is configured in a stacked full bridge topology.
Figure 3B:
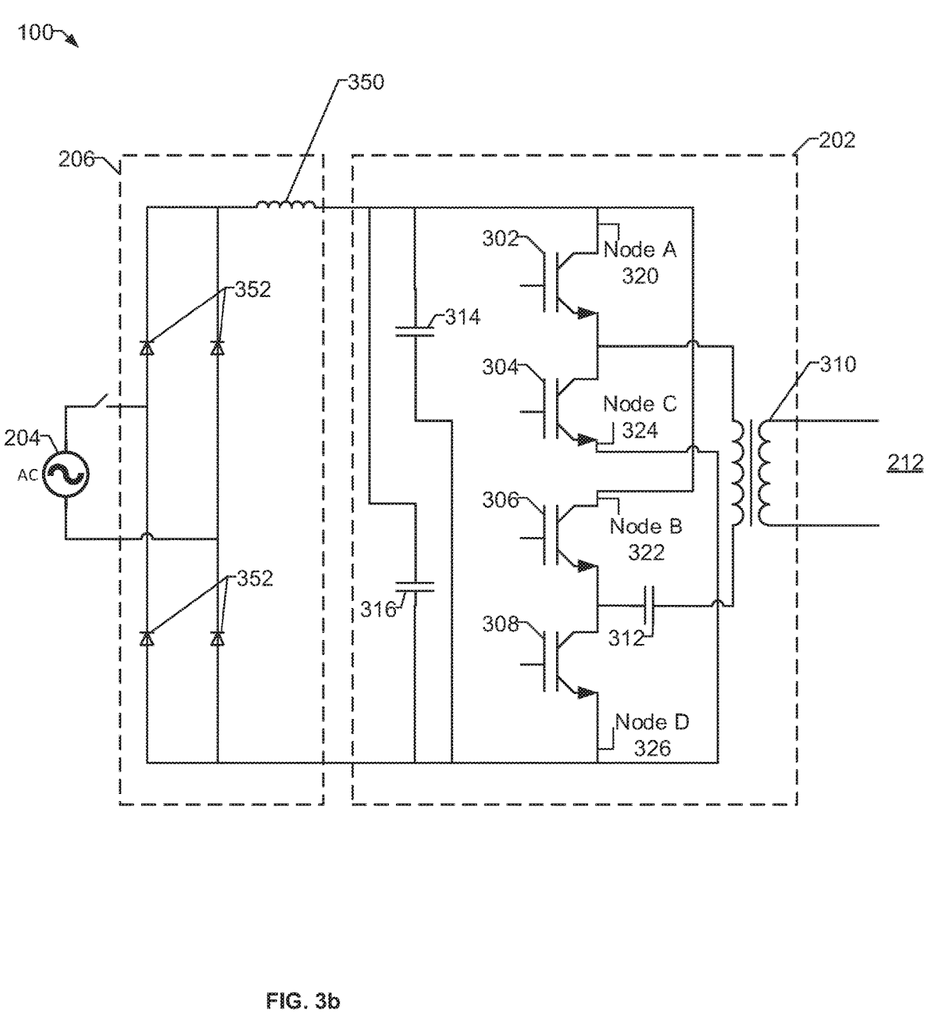
FIG. 3b is a schematic diagram of a the welding-type power supply of FIG. 2, in which the switched mode power supply is configured in a full H-bridge topology.

FIGS. 3a and 3b are schematic circuit diagrams of the power conversion circuitry (i.e., the input 204, the rectifier circuit 206, and the switched mode power supply 202) of the welding-type power supply 100. In FIG. 3a, the switched mode power supply 202 is configured in a stacked full bridge topology. In FIG. 3b, the switched mode power supply 202 is configured in a full H-bridge topology. As described with reference to FIG. 2, the welding-type power supply receives input power 204 and rectifies the input power at the rectifier circuit 206. The rectifier circuit 206 includes diodes 352 and an input inductor 350. The switched mode power supply 202 converts the rectified power to welding-type power. In some examples, a pre-regulator circuit 208 provides a regulated DC bus voltage to the switched mode power supply 202.

The switched mode power supply 202 of FIGS. 3a and 3b includes four switching elements, 302, 304, 306, and 308. The control terminals of the switching elements 302, 304, 306, and 308 (e.g., the gates when using transistors for the switching elements) are controlled by control circuitry 214 of the welding-type power supply 100. In some examples, the example switching elements 302, 304, 306, and 308 may be insulated-gate bipolar transistors (IGBTs).

The control circuitry 214 controls the switching elements 302, 304, 306, and 308 such that a controlled voltage is provided to a primary side of a high-frequency transformer 310, and the secondary side of the transformer 310 correspondingly outputs welding-type power. The switched mode power supply 202 of FIGS. 3a and 3b also include a capacitor 312 in series with the high-frequency transformer 310. The capacitor 312 allows for bidirectional current flow in the transformer 310. The switched mode power supply 202 also includes bus capacitors 314 and 316, which provide the bus voltage.

As shown in FIGS. 3a and 3b, the topology of the switched mode power supply 202 is based on the connections of the switched mode power supply 202 components (e.g. the switching elements 302, 304, 306, and 308, and the bus capacitors 314 and 316). The connections between the switched mode power supply components may be configured in several ways. For example, the switched mode power supply 202 may be manually configured via jumper wires. In some examples, a switch may be toggled (e.g., a switch on the outside of the power supply 100) which controls configuration circuitry 216 which automatically makes the connections to configure the switched mode power supply 202 into the selected configuration. In some examples, an operator may select a switched mode power supply 202 topology via the control panel 112, and the configuration circuitry 216 automatically configures the switched mode power supply 202 based on the selection. In some examples, the power supply 100 may include a slot to receive a linking device having pins (e.g., a link board). Inserting the linking board completes connections of the switched mode power supply 202, such that various linking boards may configure the switched mode power supply 202 in various topologies. In some examples, a linking board may have a header with shorted pins. The linking board may be moved from one location to another to configure the switched mode power supply 202 into various topologies.

Depending on the topology of the switched mode power supply 202, various nodes of the switched mode power supply 202 will be directly connected (e.g., shorted). For example, as shown in FIG. 3a, in the stacked full bridge topology, node C 324 is shorted with node B 322. And as shown in FIG. 3b, in the full H-bridge topology, node A 320 is sorted with node B 322, and node C 324 is shorted with node D 326. Therefore, voltage and/or resistance measurements between the nodes (node A 320, node B 322, node C 324, and node D 326) may be used to determine the actual topology of the switched mode power supply 202.

Returning to FIG. 2, in some examples, the welding-type power supply 100 includes topology detection circuitry 218 configured to determine a topology of the switched mode power supply 202. For example, the topology detection circuitry 218 may be a voltage sensor or a resistance sensor that determines the voltage and/or resistance between two or more nodes of the switched mode power supply 202. In some examples the two possible topologies are a stacked full bridge topology (as shown in FIG. 3a) and a full H-bridge topology (as shown in FIG. 3b). The topology detection circuitry 218 may measure a voltage and/or resistance between at least two nodes (320, 322, 324, and/or 326) of the switched mode power supply 202.

Specifically, to determine where the switched mode power supply 202 is configured in a stacked full bridge topology or a full H-bridge topology, the topology detection circuitry 218 may measure the voltage or resistance between: 1) node A 320 and node B 322; 2) node B 322 and node C 324; or 3) node C 324 and node D 326.

If the topology detection circuitry 218 determines that node A 320 is shorted with node B 322, then the detection circuitry 218 determines that the switched mode power supply 202 is configured in a full H-bridge topology. If the topology detection circuitry 218 determines that node A 320 is not shorted with node B 322, then the topology detection circuitry 218 determines that the switched mode power supply 202 is configured in a stacked full bridge topology.

If the topology detection circuitry 218 determines that node B 322 is shorted with node C 324, then the topology detection circuitry 218 determines that the switched mode power supply 202 is configured in a stacked full bridge topology. If the topology detection circuitry 218 determines that node B 322 is not shorted with node C 324, then the topology detection circuitry 218 determines that the switched mode power supply 202 is configured in a full H-bridge topology.

If the topology detection circuitry 218 determines that node C 324 is shorted with node D 326, then the topology detection circuitry 218 determines that the switched mode power supply 202 is configured in a full H-bridge topology. If the topology detection circuitry 218 determines that node C 324 is not shorted with node D 326, then the topology detection circuitry 218 determines that the switched mode power supply 202 is configured in a stacked full bridge topology.

In some examples, rather than a voltage or resistance sensor, the topology detection circuitry 218 may be a sensor that determines an installed position of a linking device (e.g., a link board.) The position of a linking device having pins that connects the components of the switched mode power supply 202 may determine the topology of the switched mode power supply 202. A sensor may determine the position of the linking device, and correspondingly the topology of the switched mode power supply 202. The sensor (the detection circuitry 218) may be a opto interrupter, a proximity sensor, a hall device, a switch, or the like.

In some examples, an operator may toggle a physical switch on the power supply 100 to select a certain switched mode power supply 202 topology. The topology detection circuitry 218 may determine the physical position of the switch in order to determine the topology of the switched mode power supply 202. In some examples, the operator may select a switched mode power supply 202 topology via the control panel 112, and the power supply 100 may automatically configure the switched mode power supply 202 based on the selected topology. The control panel 112 may send a signal to the control circuitry 214 indicating the selected topology.

The welding-type power supply 100 also includes input power detection circuitry 220. The input power detection circuitry 220 measures the voltage of the input power 204.

The control circuitry 214 determines if the measured input voltage corresponds to the switched mode power supply 202 topology determined by the topology detection circuitry 218. For example, a stacked full bridge topology may correspond to a high input voltage range, and a full H-bridge topology may correspond to a lower input voltage range. In some examples, a stacked full bridge topology may not operate efficiently at low input voltages. In some examples, operating a switched mode power supply having a full H-bridge topology may at high input voltages may result in damage to the power electronics of the power supply.

In other words, in some examples a switched mode power supply 202 may be configurable in two topologies, a stacked full bridge topology and a full H-bridge topology, as shown in FIGS. 3a and 3b. In such examples, there are four possible voltage input level and topology combinations. Two combinations are operable: 1) high input voltage and stacked full bridge (where high input voltage refers to an input voltage above a predetermined threshold, e.g., 300 VAC); and 2) low input voltage and full H-bridge (where low input voltage refers to a voltage at or below a threshold, e.g., 300 VAC). Two of the four possible combinations are not desirable and may result in a lack of efficiency or damage to the power electronics: 1) high input voltage and full H-bridge; and 2) low input voltage and stacked full bridge. Therefore, the power supply 100 includes circuitry (e.g., the control circuitry 214, topology detection circuitry 218, and/or input detection) configured to verify that the switched mode power supply 202 topology corresponds to the input voltage range.

For example, the stacked full bridge topology may correspond to an input voltage of 300 VAC to 600 VAC, and a full H-bridge topology may correspond to an input voltage of less than 300 VAC. The control circuitry 214 may signal an alert if the switched mode power supply 202 topology determined by the topology detection circuitry 218 does not correspond to the input voltage determined by the input detection circuitry 220. For example, the control circuitry 214 may indicate an error and the type of error to the control panel 112 of the welding-type power supply 100. Accordingly, an operator can configure the switched mode power supply 202 such that the switched mode power supply 202 topology corresponds to the input voltage or adjust the input voltage to corresponds to the topology of the switched mode power supply 202.

In some examples, the control circuitry 214 disables the switched mode power supply 202 (e.g., disable output from the switched mode power supply 202) if the determined topology of the switched mode power supply 202 does not correspond to the determined input voltage. In some examples, the control circuitry 214 disables a start-up sequence of the welding-type power supply 100 if the determined topology of the switched mode power supply 202 does not correspond to the determined input voltage. In some examples, the control circuitry 214 may not allow an operator to select any weld parameters or weld processes (e.g., via the control panel 112) until an operator reconfigures the switched mode power supply 202 topology or adjusts the input voltage (e.g., until the control circuitry 214 determines that the switched mode power supply 202 topology corresponds to the determined input voltage.) In some examples, the control circuitry 214 continuously monitors the switched mode power supply 202 topology and the input voltage, and signals an error at any time when the switched mode power supply 202 topology does not correspond to the input voltage.

Figure 4:
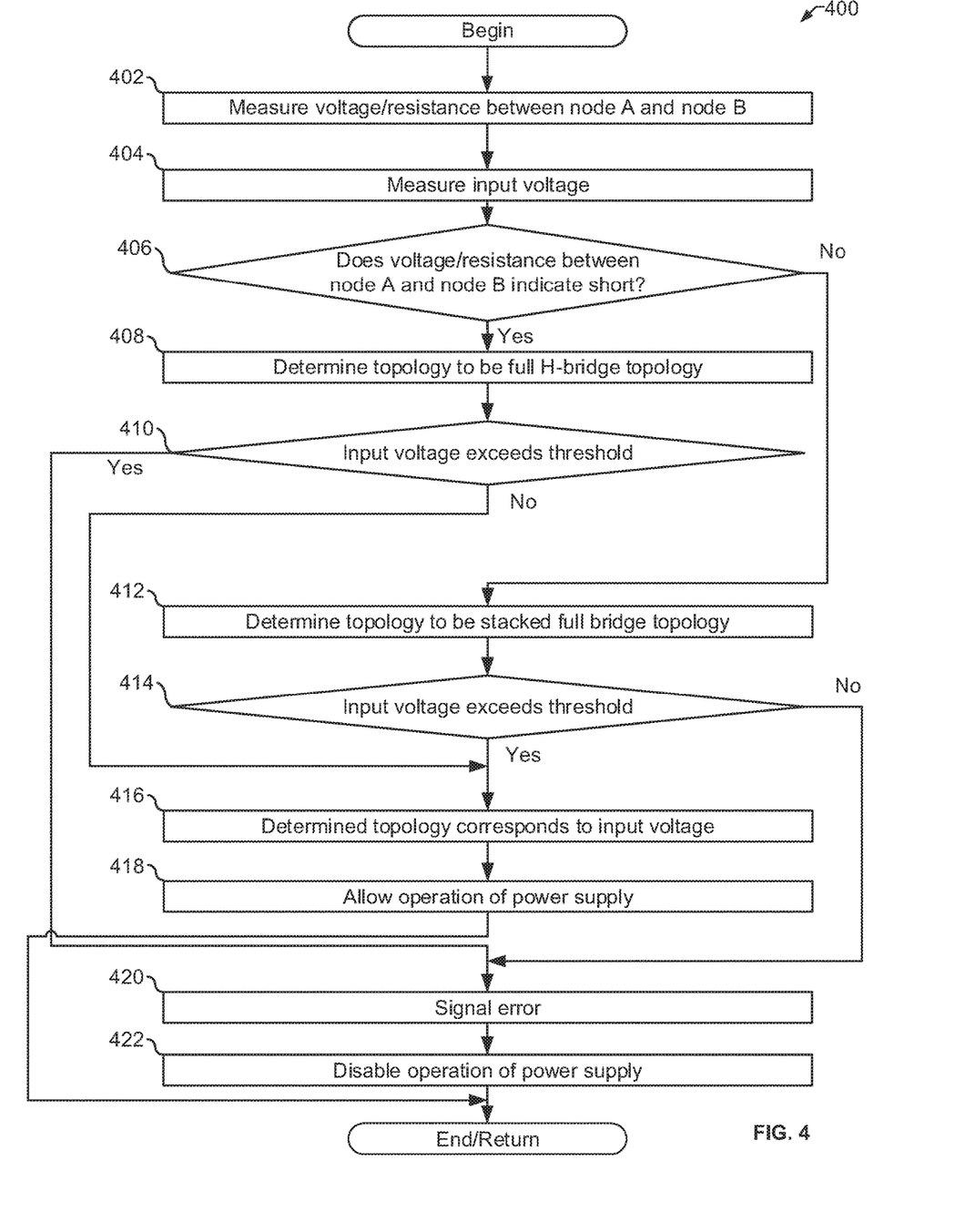
FIG. 4 is a flowchart illustrating example machine readable instructions which may be executed by the example welding-type power supply of FIG. 2 to determine a switched mode power supply topology and verify that the determined switched mode power supply topology corresponds to a measured input power voltage.

FIG. 4 is a flowchart illustrating example machine readable instructions 400 which may be executed by the example topology detection circuitry 218, input detection circuitry 220, the control circuitry 214 and/or, more generally, the welding-type power supply 100 of FIG. 2 to verify that the switched mode power supply topology 202 corresponds to the input voltage.

At block 402, the topology detection circuitry 218 measures a voltage or a resistance between node A 320 and node B 322. At block 404, the input detection circuitry 220 measures the input voltage of the AC input power 204. At block 406, the control circuitry 214 determines whether the measured voltage or resistance between node A 320 and node B 322 indicates that node A 320 is shorted with node B 322.

If node A 320 is shorted with node B 322 (block 406), then at block 408 the control circuitry 214 determines that the switched mode power supply 202 is configured in a full H-bridge topology. At block 410, the control circuitry 214 determines whether the input voltage measured at block 404 exceeds a threshold. The threshold may be, for example, 300 VAC. If the input voltage does not exceed the threshold (block 410), then the control circuitry 214 proceeds to block 416. If the input voltage exceeds the threshold (block 410), then the control circuitry 214 proceeds to block 420.

If node A 320 is not shorted with node B 322 (block 406), then at block 412, the control circuitry 214 determines that the switched mode power supply 202 is configured in a stacked full bridge topology. At block 414, the control circuitry 214 determines whether the input voltage measured at block 404 exceeds the threshold (the same threshold as in block 410). If the input voltage exceeds the threshold (block 414), then the control circuitry 214 proceeds to block 416. If the input voltage does not exceed the threshold (block 414), then the control circuitry 214 proceeds to block 420.

At block 416, the control circuitry 214 determines that the topology of the switched mode power 202 supply corresponds to the input voltage. At block 418, the control circuitry 214 may then allow a start-up routine of the welding-type power supply 100, allow operation of the switched mode power supply 202, allow an operator to input weld parameters into the control panel 112, and/or otherwise allow normal operation of the power supply 100. In some examples, the control circuitry 214 may then return to block 402 to continuously monitor that the switched mode power supply 202 topology corresponds to the input voltage.

At block 420, the control circuitry 214 determines that the switched mode power supply 202 topology does not correspond to the input voltage and signals an error. At block 422, the control circuitry 214 may then disable a start-up routine of the welding-type power supply, disable operation of the switched mode power supply 202, prevent an operator from inputting weld parameters into the control panel 112, indicate on the control panel 112 or via some visible or audible indicator that the switched mode power supply 202 topology does not correspond to the input voltage, or otherwise allow normal operation of the power supply 100.

Although the instructions 400 include measuring the voltage or resistance between nodes A 320 and node B 322, as explained above the control circuitry 214 and/or the topology detection circuitry 218 may also or instead measure the resistance and/or voltage between: node B 322 and node C 324; or 3) node C 324 and node D 326 in order to determine whether the switched mode power supply 202 is configured in a stacked full bridge topology or a full H-bridge topology. And as described above, in some examples, rather than measuring the resistance or voltage between nodes, the control circuitry 214 may receive an indication from another sensor (or the control panel 112 or a manipulable switch) which indicates the switched mode power supply 202 topology.

While the present methods and/or systems have been described with reference to certain implementations, it will be understood by those skilled in the art that various changes may be made and equivalents may be substituted without departing from the scope of the present method and/or system. For example, block and/or components of disclosed examples may be combined, divided, re-arranged, and/or otherwise modified. In addition, many modifications may be made to adapt a particular situation or material to the teachings of the present disclosure without departing from its scope. Therefore, the present method and/or system are not limited to the particular implementations disclosed. Instead, the present method and/or system will include all implementations falling within the scope of the appended claims, both literally and under the doctrine of equivalents.

What is claimed is:

1. A welding-type power supply comprising:
power conversion circuitry configured to receive input power and convert the input power to welding-type power, the power conversion circuitry comprising a switched mode power supply;
a voltage sensor configured to measure a voltage between at least two nodes of the switched mode power supply;
detection circuitry configured to:
determine if a configured topology of the switched mode power supply is a first topology or a second topology based on whether the measured voltage exceeds a threshold; and
control circuitry configured to:
determine if an input voltage of the input power corresponds to the first topology or the second topology.

2. The welding-type power supply of claim 1, wherein the control circuitry is further configured to prevent the power conversion circuitry from outputting the welding-type power if the input voltage does not correspond to the configured switched mode power supply topology.

3. The welding-type power supply of claim 1, wherein the control circuitry is further configured to prevent the welding-type power supply from executing a start-up routine if the input voltage does not correspond to the configured switched mode power supply topology.

4. The welding-type power supply of claim 1, wherein the first topology is a Full H-bridge topology and the second topology is a stacked full bridge topology.

5. The welding-type power supply of claim 4, wherein the detection circuitry is configured to compare a magnitude of the input voltage to a threshold to determine whether the input voltage corresponds to a Full H-bridge topology or a stacked full bridge topology.

6. The welding-type power supply of claim 5, wherein the input voltage corresponds to the stacked full bridge topology if the magnitude exceeds the threshold.

7. The welding-type power supply of claim 1, further comprising a resistance sensor to measure a resistance between the at least two nodes of the switched mode power supply, wherein the detection circuitry is further configured to determine the configured topology of the switched mode power supply based on the measured resistance.

8. The welding-type power supply of claim 4, wherein the switched mode power supply comprises four switches.

9. The welding-type power supply of claim 8, further comprising a sensor configured to measure at least one of a voltage difference or a resistance between at least two of the switches.

10. The welding-type power supply of claim 9, wherein the detection circuitry is configured to determine that the configured topology is the stacked full-bridge topology in response to determining that the measured voltage exceeds the threshold.

11. The welding-type power supply of claim 9, wherein the detection circuitry is configured to determine that the configured topology is the stacked full-bridge topology in response to determining that the measured resistance exceeds a threshold.

12. The welding-type power supply of claim 9, wherein the detection circuitry is configured to determine that the configured topology is the Full H-bridge topology in response to determining that the measured voltage exceeds the threshold.

13. The welding-type power supply of claim 9, wherein the detection circuitry is further configured to determine that the topology is the Full H-bridge topology if the measured resistance exceeds a threshold.

14. The welding-type power supply of claim 1, wherein the control circuitry is configured to output an alert if the input voltage does not correspond to the configured switched mode power supply topology.

15. The welding-type power supply of claim 14, further comprising a user interface, wherein the user interface is configured to provide an indication that the input voltage does not correspond to the configured switched mode power supply topology.

16. The welding-type power supply of claim 1, wherein the detection circuitry comprises a sensor configured to determine an installed position of at least one connector of the switched mode power supply.

17. The welding-type power supply of claim 1, further comprising a user operable switch configured to select the topology of the switched mode power supply based on a position of the switch, and wherein the detection circuitry is configured to determine the configured topology based on a detection of the position of the switch.

18. The welding-type power supply of claim 1, further comprising a linking board, wherein an installed position of the linking board controls the configured topology of the switched mode power supply, and wherein the detection circuitry is configured to determine the configured topology based on a detection of the installed position of the linking board.

19. A welding-type power supply comprising:
an input configured to receive input power;
a sensor configured to measure a magnitude of the voltage of the input power;
a switched mode power supply; and
detection circuitry configured to:
determine if a configured topology of the switched mode power supply is a first topology or a second topology based on determining whether a predetermined pair of nodes of the switched mode power supply are short circuited; and
control circuitry configured to:
determine if the measured magnitude of the voltage of the input power corresponds to the first topology or the second topology.

20. The welding-type power supply of claim 1, wherein the first topology includes a second predetermined node short circuited with a third predetermined node of the at least two nodes and wherein the second topology includes a first predetermined node short circuited with the second predetermined node and the third predetermined node short circuited with a fourth predetermined node.

* * * * *